US007719900B2

(12) United States Patent
Okayama et al.

(10) Patent No.: US 7,719,900 B2
(45) Date of Patent: May 18, 2010

(54) SEMICONDUCTOR STORAGE DEVICE HAVING MEMORY CELL FOR STORING DATA BY USING DIFFERENCE IN THRESHOLD VOLTAGE

(75) Inventors: Shota Okayama, Tokyo (JP); Ken Matsubara, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 614 days.

(21) Appl. No.: 11/475,189

(22) Filed: Jun. 27, 2006

(65) Prior Publication Data
US 2007/0002632 A1 Jan. 4, 2007

(30) Foreign Application Priority Data
Jun. 30, 2005 (JP) ............................. 2005-192140

(51) Int. Cl.
*G11C 16/06* (2006.01)
(52) U.S. Cl. ............................. 365/185.24; 365/185.18; 365/210.1; 365/185.2; 257/314; 326/35; 327/37; 327/80; 340/511; 714/721; 702/193
(58) Field of Classification Search ............ 365/185.24, 365/185.18, 210.1, 185.2; 257/314; 326/35; 327/37, 80; 340/511; 714/721; 702/193
See application file for complete search history.

(56) References Cited

U.S. PATENT DOCUMENTS

| 5,600,593 | A | * | 2/1997 | Fong ..................... 365/185.19 |
| 5,754,475 | A | * | 5/1998 | Bill et al. ................ 365/185.25 |
| 6,480,415 | B2 | * | 11/2002 | Makuta et al. ......... 365/185.09 |
| 6,525,969 | B1 | * | 2/2003 | Kurihara et al. ........ 365/185.25 |
| 6,657,891 | B1 | | 12/2003 | Shibata et al. |
| 6,839,279 | B2 | * | 1/2005 | Yamada .................... 365/185.2 |
| 7,020,037 | B2 | * | 3/2006 | Anzai et al. .............. 365/210.1 |
| 7,054,197 | B2 | * | 5/2006 | Vimercati .............. 365/185.18 |
| 2004/0165443 | A1 | * | 8/2004 | Harari ................... 365/185.18 |
| 2004/0257876 | A1 | * | 12/2004 | Vimercati .............. 365/185.21 |

FOREIGN PATENT DOCUMENTS

JP 2004-192789 7/2004

OTHER PUBLICATIONS

Y.Sasago, et. al., "90-nm-node mult-level AG-AND type flash memory with cell size of true 2 F2/bit and programming throughput of 10 MB/s", IEDM Tech. Dig., 2003, pp. 823-826.

* cited by examiner

*Primary Examiner*—VanThu Nguyen
*Assistant Examiner*—Eric Wendler
(74) *Attorney, Agent, or Firm*—McDermott Will & Emery LLP

(57) ABSTRACT

A semiconductor storage device which includes a memory array including a plurality of memory cells for storing data by using a difference in a threshold voltage and at least one reference cell for storing data indicative of a state of a corresponding memory cell by using a difference in a threshold voltage, a control circuit for determining a read voltage based on data stored by a reference cell corresponding to a memory cell adjacent to a memory cell to be read, a read unit for executing reading from a memory cell to be read by using a determined read voltage, and a write unit for executing writing, when executing writing to a memory cell to be written to bring the memory cell into a written state, data indicating that the memory cell is in the written state to a reference cell corresponding to the memory cell.

7 Claims, 16 Drawing Sheets

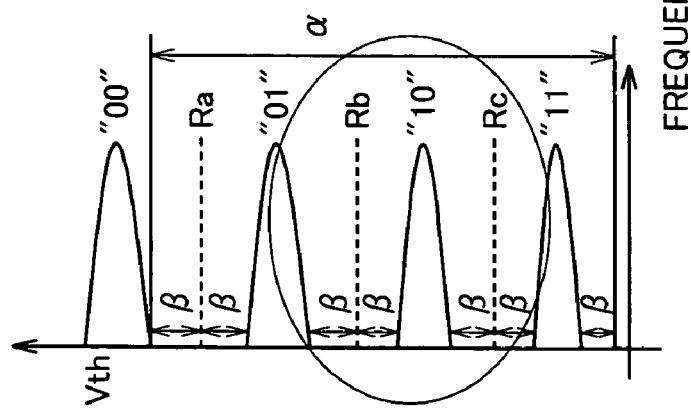
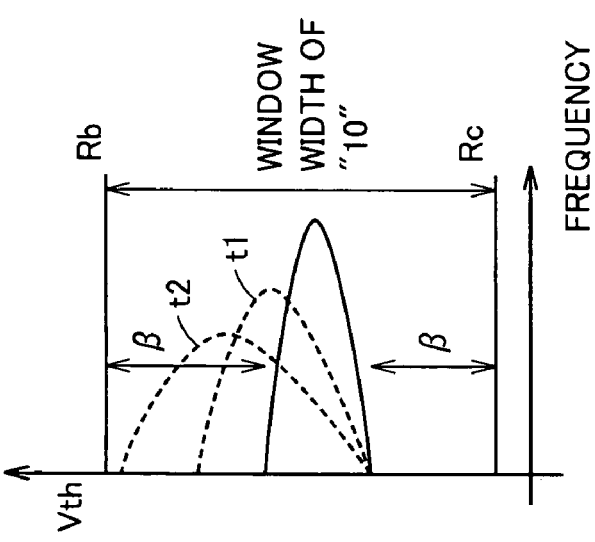
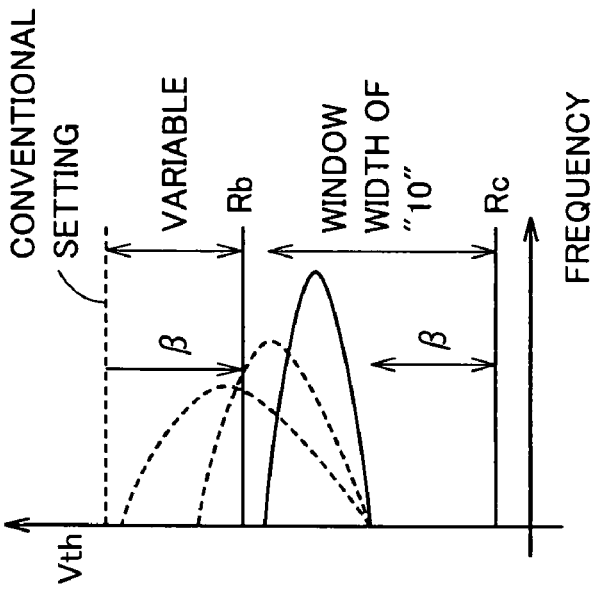

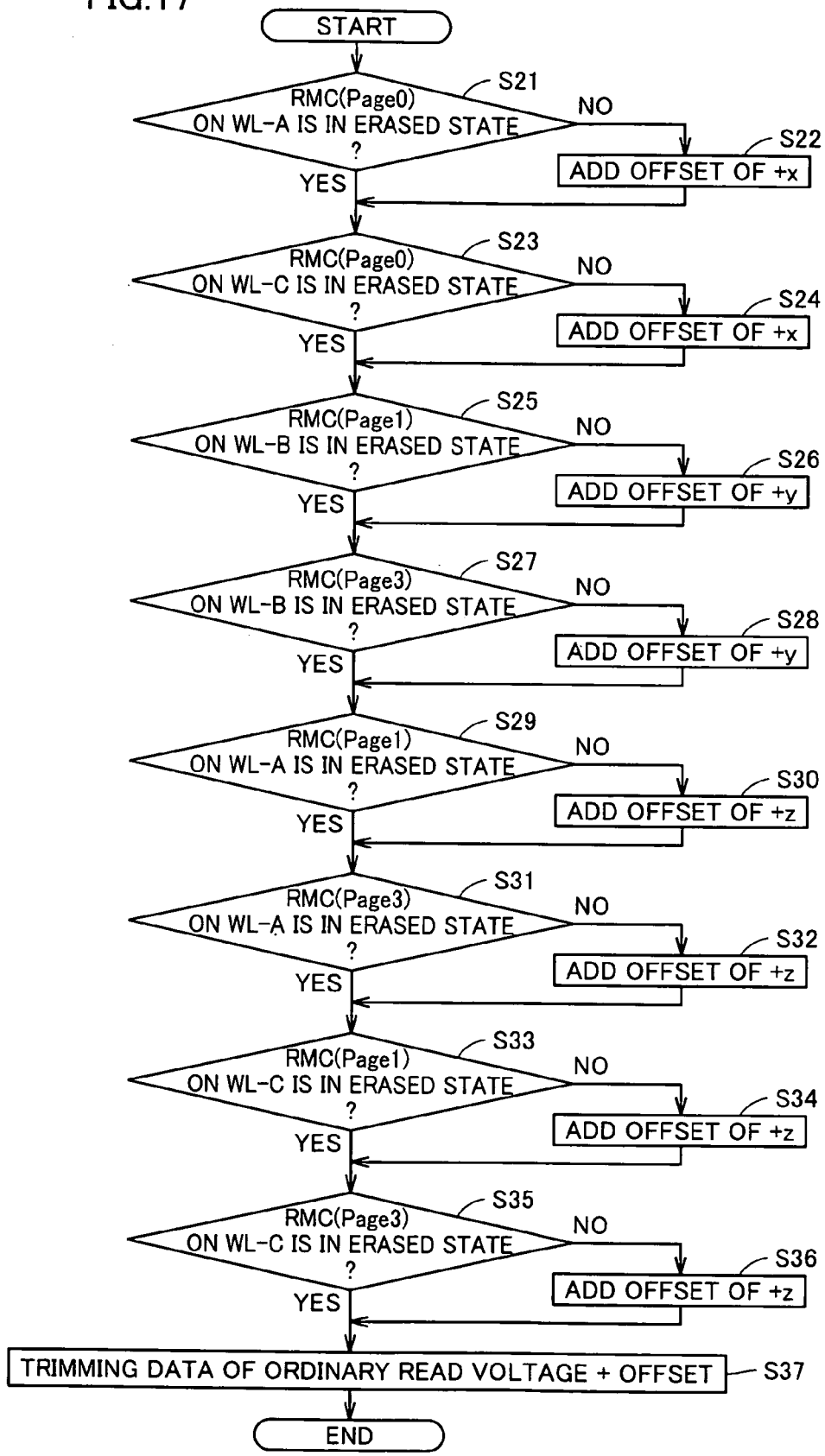

SEMICONDUCTOR STORAGE DEVICE HAVING MEMORY CELL FOR STORING DATA BY USING DIFFERENCE IN THRESHOLD VOLTAGE

BACKGROUND OF THE INVENTION

1. Field of the Invention

The present invention relates to a semiconductor storage device and, more particularly, a semiconductor storage device having a memory cell for storing data by using a difference in a threshold voltage.

2. Description of the Background Art

A semiconductor storage device capable of storing information by injecting electrons into a floating gate (FG) or extracting the electrons has been developed such as a flash memory. Flash memory includes a memory cell having a floating gate, a control gate, a source and a drain. Memory cell has its threshold voltage increased when electrons are injected into the floating gate and has its threshold voltage decreased when the electrons are extracted from the floating gate.

Here, scale-down of a semiconductor process makes an expansion of a distribution of Vth (threshold voltage) derived from FG-FG coupling (hereinafter referred to as Vth fluctuation) be extremely large. FG-FG coupling is a phenomenon that when a potential of an FG is varied by injection or extraction of electrons into/from the FG, a potential of an adjacent FG is varied as well due to parasitic-capacitance between the FGs to fluctuate a threshold voltage of a memory cell.

In order to solve the problem, such a semiconductor storage device as will be described in the following is disclosed, for example, in Japanese Patent Laying-Open No. 2004-192789 (Patent Literature 1). More specifically, to a memory cell in which data of i (i denotes a natural number not less than 2) bits is stored, before storing subsequent data, data of not more than i bits is written to an adjacent memory cell. The writing of the data of not more than i bits is executed at a voltage lower than an original threshold voltage (actual threshold voltage at the time of storing i-bit data). After the writing to the adjacent memory cell, writing is executed to increase the threshold voltage of the memory cell which stores the i-bit data. Before and after the writing to increase the threshold voltage, it will be unclear that the i-bit data is at an original threshold voltage or a voltage lower than the threshold voltage. For the discrimination thereof, prepare a memory cell for flag (flag cell) to execute reading operation according to data of the flag cell.

The semiconductor storage device recited in Patent Literature 1, however, is structured to prevent a reading error due to Vth fluctuation caused by the effect of a memory cell adjacent to a memory cell to be read (hereinafter referred to as an adjacent memory cell) in the same word line, so that it is impossible to prevent a reading error due to Vth fluctuation caused by the effect of an adjacent memory cell in other adjacent word line (hereinafter referred to as an adjacent word line). In addition, with the semiconductor storage device recited in Patent Literature 1, a reading error caused by Vth fluctuation of a memory cell storing data of not a plurality of bits but one bit can not be prevented. The semiconductor storage device recited in Patent Literature 1 therefore has a problem that a reading error caused by Vth fluctuation can not be satisfactorily prevented.

Also known is a method of preventing a reading error caused by Vth fluctuation by expanding a Vth window, that is, a range of a threshold voltage of a memory cell. When a lower-limit threshold voltage of a Vth window is decreased, however, a leakage current is liable to flow to cause a problem of erroneous reading. On other hand, increasing an upper-limit threshold voltage of the Vth window results in lowering a writing speed. Moreover, because electrons in an FG are liable to go out from the FG for returning to a thermally equilibrium state and because in a memory cell whose threshold voltage is high, the number of electrons accumulated in the FG is large, an increase in the upper-limit threshold voltage of the Vth window invites electrons to go through the FG, so that the threshold voltage of the memory cell is liable to lower to deteriorate retention characteristics (data holding characteristics). In other words, expanding a Vth window involves degradation in reliability of a semiconductor storage device.

SUMMARY OF THE INVENTION

An object of the present invention is to provide a semiconductor storage device in which a reading error caused by Vth fluctuation can be satisfactorily prevented without expanding a Vth window.

A semiconductor storage device according to one aspect of the present invention includes a plurality of memory cells for storing data by using a difference in a threshold voltage, at least one reference cell for storing data indicative of a state of a corresponding memory cell by using a difference in a threshold voltage, a control circuit for determining a read voltage based on data stored by a reference cell corresponding to a memory cell adjacent to a memory cell to be read, a read unit for executing reading from a memory cell to be read by using a determined read voltage, and a write unit for executing writing, when bringing a memory cell to be written into a written state by executing writing, data indicating that a memory cell to be written is in the written state to a reference cell corresponding to the memory cell to be written.

A semiconductor storage device according to another aspect of the present invention includes a plurality of memory cells for storing data by using a difference in a threshold voltage, at least one reference cell for storing data indicative of a state of a corresponding memory cell by using a difference in a threshold voltage, a control circuit for storing a plurality of read voltages for each determination position of a logical level of data to select one of the plurality of read voltages according to data stored by a reference cell corresponding to a memory cell adjacent to a memory cell to be read, and a read unit for executing reading from a memory cell to be read by using a selected read voltage, in which the reference cell allows neither external reading nor external writing.

According to the present invention, a reading error caused by Vth fluctuation can be satisfactorily prevented without expanding a Vth window.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 14A to 14C are diagrams showing fluctuation of a threshold voltage in a memory cell on a word line WL-B which is caused by the effect of an adjacent memory cell and correction of a read voltage executed by the semiconductor storage device according to the present embodiment.

FIG. 17 is a flow chart which defines a procedure of operation executed when control circuit 11 in the semiconductor storage device according to the third embodiment of the present invention corrects a read voltage.

DESCRIPTION OF THE PREFERRED EMBODIMENTS

Figure 1:
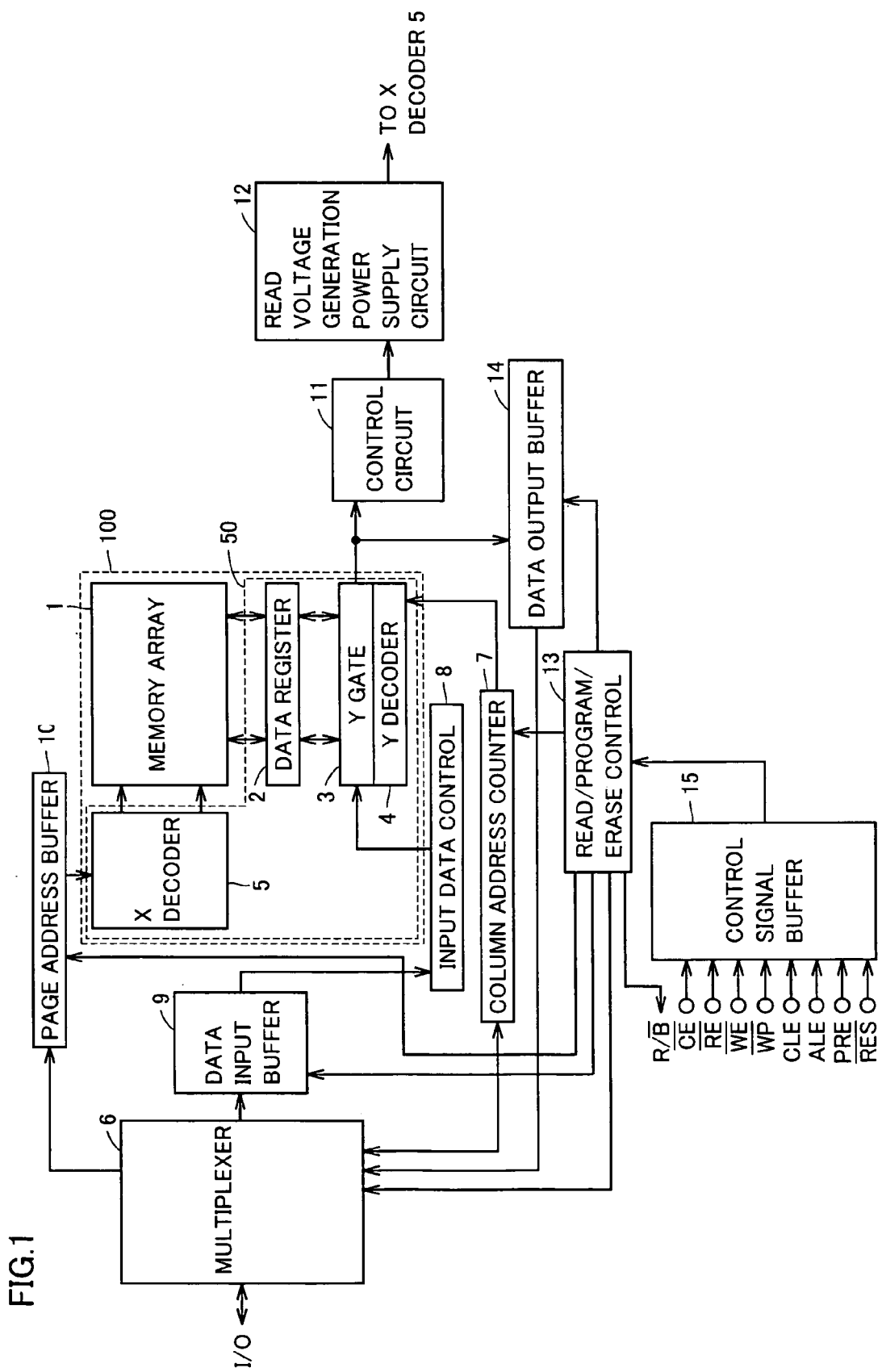
FIG. 1 is a diagram showing a structure of a semiconductor storage device according to a first embodiment of the present invention.

In the following, embodiments of the present invention will be described with reference to the drawings. In the drawings, the same or corresponding parts are indicated by the same reference numerals to omit their description.

First Embodiment

Structure and Basic Operation

FIG. 1 is a diagram showing a structure of a semiconductor storage device according to a first embodiment of the present invention.

With reference to FIG. 1, the semiconductor storage device includes a bank 100, multiplexer 6, a column address counter 7, an input data control 8, a data input buffer 9, a page address buffer 10, a control circuit 11, a read voltage generation power supply circuit 12, a read•program•erase control 13, a data output buffer 14 and a control signal buffer 15.

Bank 100 includes a memory array 1, a data register 2, a Y gate 3, a Y decoder 4 and an X decoder 5. The semiconductor storage device according to the present embodiment has at least one bank 100.

Memory array 1 includes a plurality of memory cells for ordinary use. Memory array 1 also includes at least one RMC (Reference Memory Cell) having the same structure as that of a memory cell for ordinary use.

Data register 2, Y gate 3, Y decoder 4 and X decoder 5 form a read/write unit 50 to execute reading and writing from/to a memory cell of memory array 1.

An externally input address signal is output to page address buffer 10 and column address counter 7 through multiplexer 6. Externally input data is also output to Y gate 3 through multiplexer 6, data input buffer 9 and input data control 8. Data read from memory array 1 is externally output through data register 2, Y gate 3, data output buffer 14 and multiplexer 6.

Page address buffer 10 outputs an address signal according to a page as a unit whose data can be written by one writing to X decoder 5.

X decoder 5 decodes the address signal received from page address buffer 10 to select a word line corresponding to a specific memory cell in memory array 1. Then, X decoder 5 drives the selected word line by a fixed voltage. Here, X decoder 5, at data reading, drives a word line by using a read voltage supplied from read voltage generation power supply circuit 12 which will be described later. With a control gate of each memory cell connected to a word line, a read voltage is applied to the control gate of each memory cell through the word line.

Column address counter 7 outputs an address signal according to a page to Y decoder 4. Column address counter 7 outputs an address signal sequentially incremented from a specific address to Y decoder 4.

Y decoder 4 decodes the address signal received from column address counter 7 to generate a selection signal and output the selection signal to Y gate 3.

Y gate 3 preserves data received from input data control 8 at an address of data register 2 indicated by the selection signal received from Y decoder 4 or obtains data preserved at an address of data register 2 indicated by the selection signal received from Y decoder 4.

Data register 2 selects a bit line of memory array 1 corresponding to the address of data register 2 indicated by the selection signal. By the selection of a word line by X decoder 5 and the selection of a bit line by data register 2, Y gate 3 and Y decoder 4, a memory cell to be written and a memory cell to be read can be specified.

Here, data writing to a memory cell is executed, for example, by applying a predetermined voltage to a control gate, a drain and a source of the memory cell to inject electrons into a floating gate, thereby gradually increasing a threshold voltage. More specifically, data register 2, Y gate 3, Y decoder 4 and X decoder 5 execute data writing by making a threshold voltage of a memory cell to be written be a threshold voltage corresponding to a logical level of data received from input data control 8.

In addition, data reading from a memory cell is executed, for example, by applying a read voltage corresponding to each logical level to the control gate of the memory cell to determine a logical level of the data based on whether current flows between the source and the drain of the memory cell. Data read from a memory cell to be read by such a method is preserved in data register 2 and externally output through Y gate 3, data output buffer 14 and multiplexer 6.

Read•program•erase control 13 controls each circuit to execute writing to, reading from and erasing of a memory cell based on an externally input command signal through control signal buffer 15.

Control circuit 11 determines a read voltage value based on data stored by an RMC to output trimming data indicative of the determined read voltage value to read voltage generation power supply circuit 12.

Read voltage generation power supply circuit 12 generates a read voltage based on trimming data received from control circuit 11 and supplies the voltage to X decoder 5.

Figure 2:
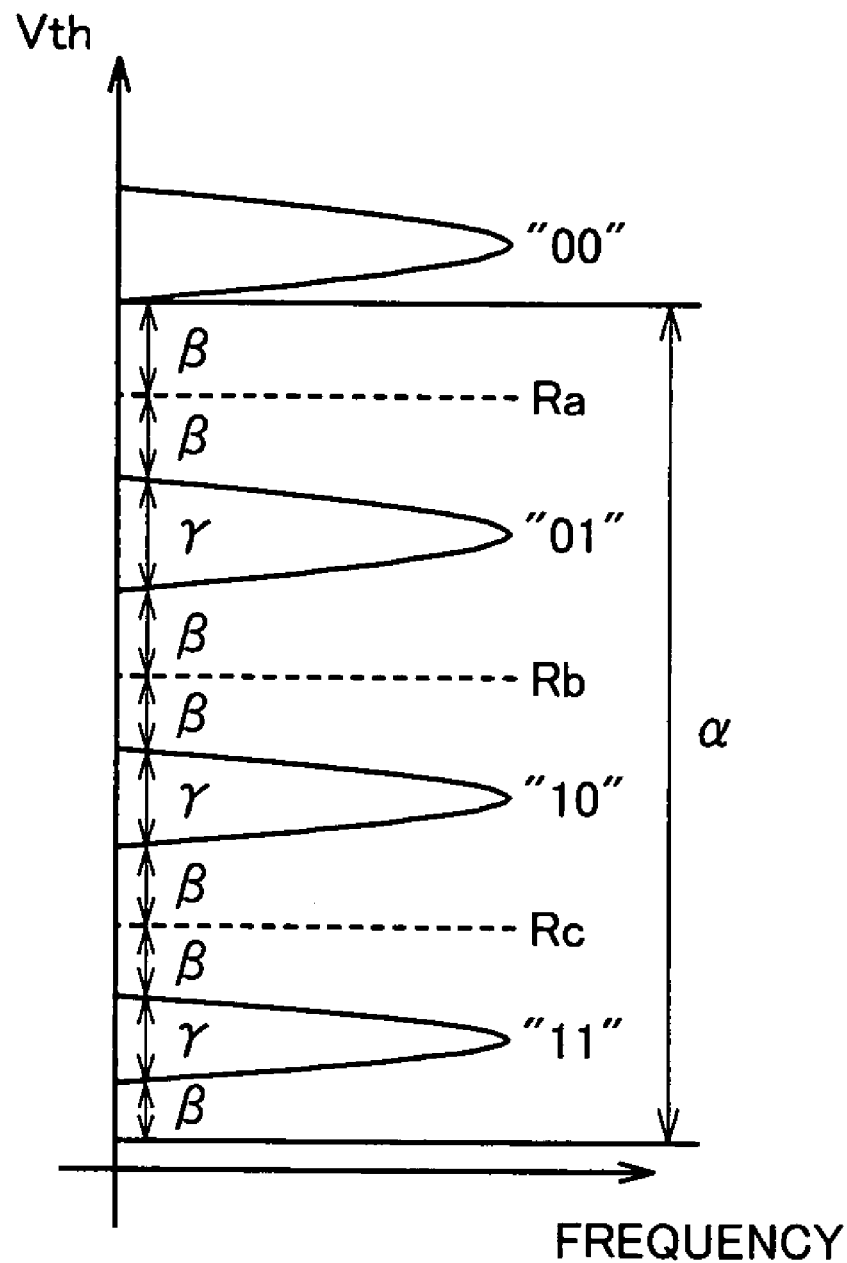
FIG. 2 is a diagram showing a threshold voltage of a memory cell when a conventional semiconductor storage device stores 2-bit data.

FIG. 2 is a diagram showing a threshold voltage of a memory cell when a conventional semiconductor storage device stores 2-bit data.

With reference to FIG. 2, a distribution of the lowest voltages among the threshold voltages corresponds to a logical level "11". Hereafter, this state will be referred to as an erased state. By the writing to a memory cell to bring a threshold voltage to be higher than that of the erased state, threshold voltages corresponding to logical levels "10", "01" and "00" are obtained. In the following, this state will be referred to as a written state.

When the semiconductor storage device stores one-bit data, the erased state corresponds to a logical level "1" and the written state corresponds to a logical level "0".

Correspondence between a threshold voltage and a logical level is not limited to those described above and it may have, for example, a corresponding relationship in which logical levels are inverted from those described above.

α represents a width of a Vth window, β represents a margin of a read voltage for a threshold voltage distribution, γ represents a width of a threshold voltage distribution and Ra, Rb and Rc represent a read voltage. β is a value obtained by experiment or the like, for which a value enabling a reading error due to Vth fluctuation to be prevented is set. In a conventional semiconductor storage device, a margin of a read voltage for a threshold voltage distribution is fixed to β.

Next, description will be made of various kinds of flash memories with respect to a structure of memory array 1 in which RMC is disposed.

Figure 3:
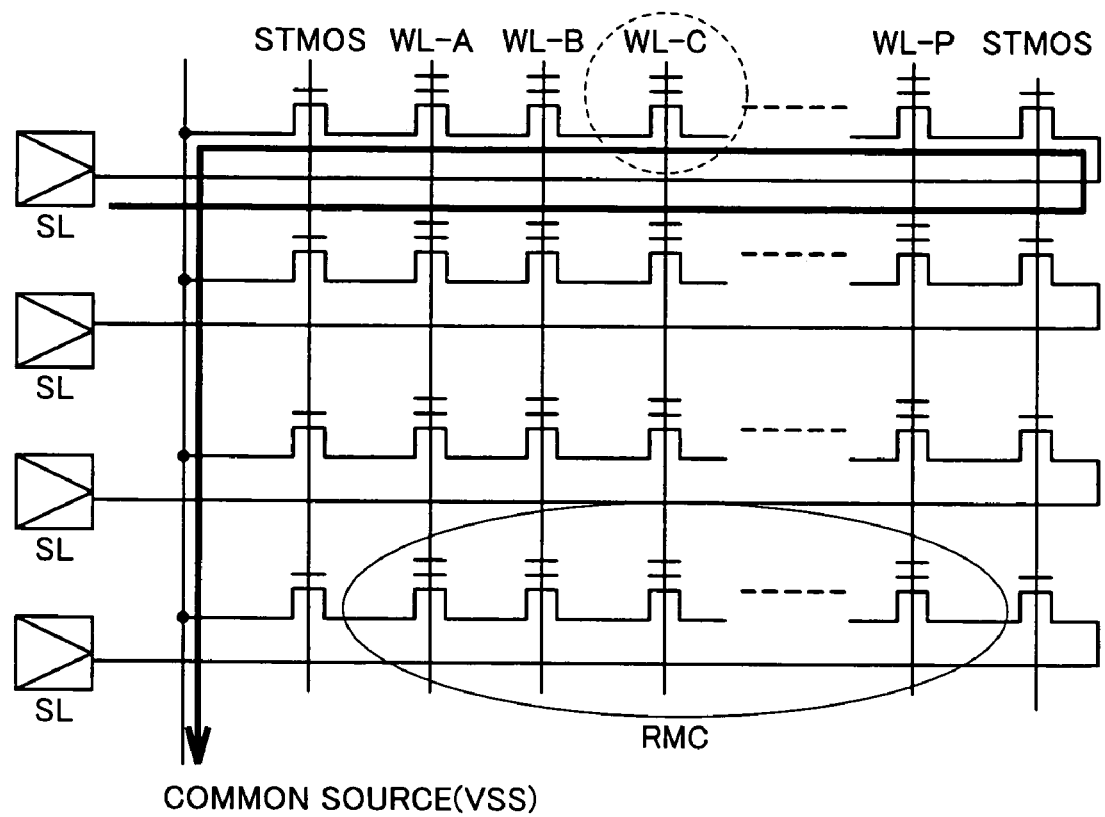
FIG. 3 is a diagram showing one example of a structure of a memory array 1 in the semiconductor storage device according to the present embodiment.
Figure 4:
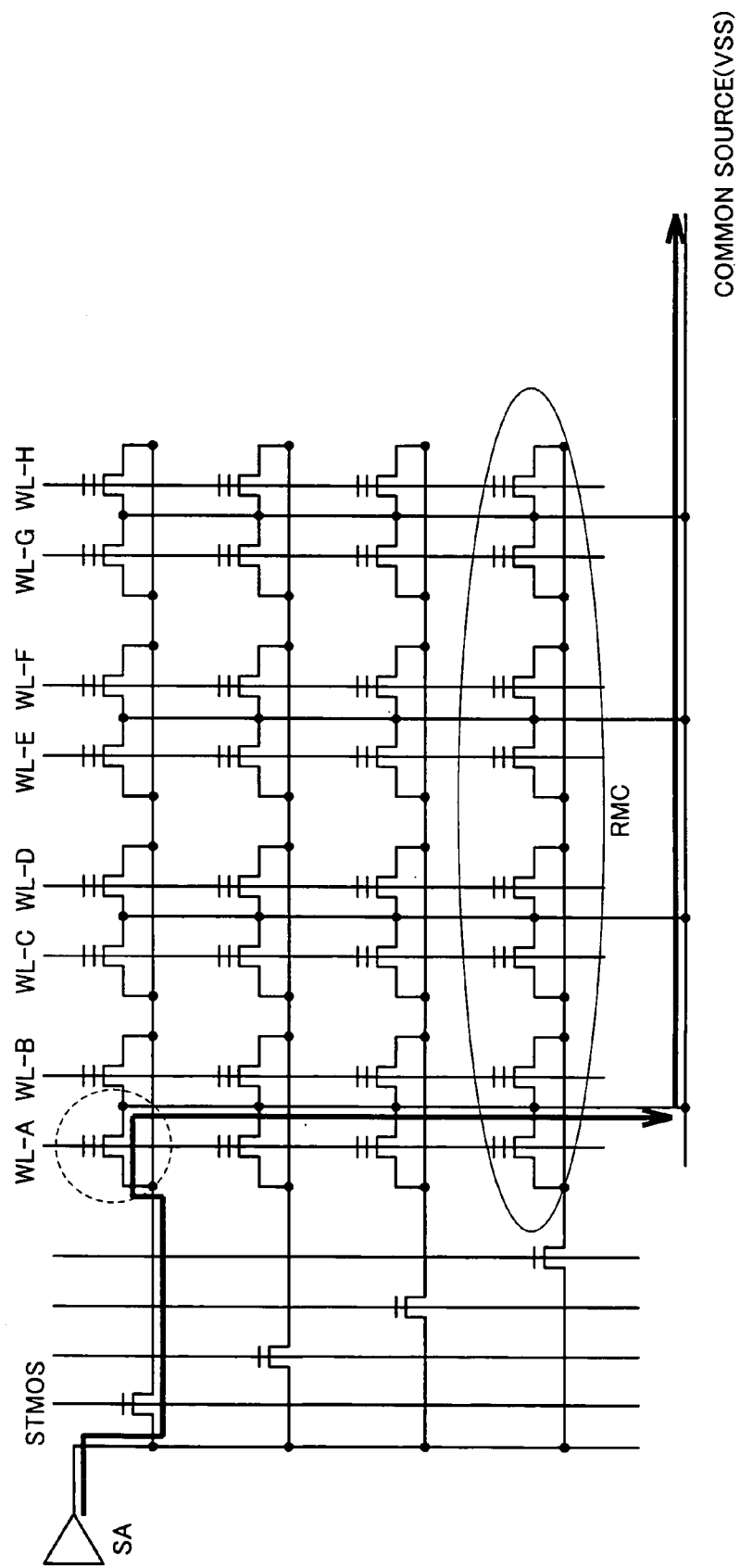
FIG. 4 is a diagram showing another example of a structure of memory array 1 in the semiconductor storage device according to the present embodiment.

FIG. 3 is a diagram showing one example of a structure of memory array 1 in the semiconductor storage device according to the present embodiment. With reference to FIG. 3, memory array 1 is a memory array of a NAND flash memory. FIG. 4 is a diagram showing another example of a structure of memory array 1 in the semiconductor storage device according to the present embodiment. With reference to FIG. 4, memory array 1 is a memory array of a NOR flash memory.

In FIG. 3 and FIG. 4, a memory cell surrounded by a dotted circle represents a memory cell to be read and an arrow represents a current path at the time of reading. With reference to FIG. 3 and FIG. 4, memory array 1 includes a memory cell for ordinary use, an RMC and a selection gate (STMOS). RMC is disposed one in each word line.

Figure 5:
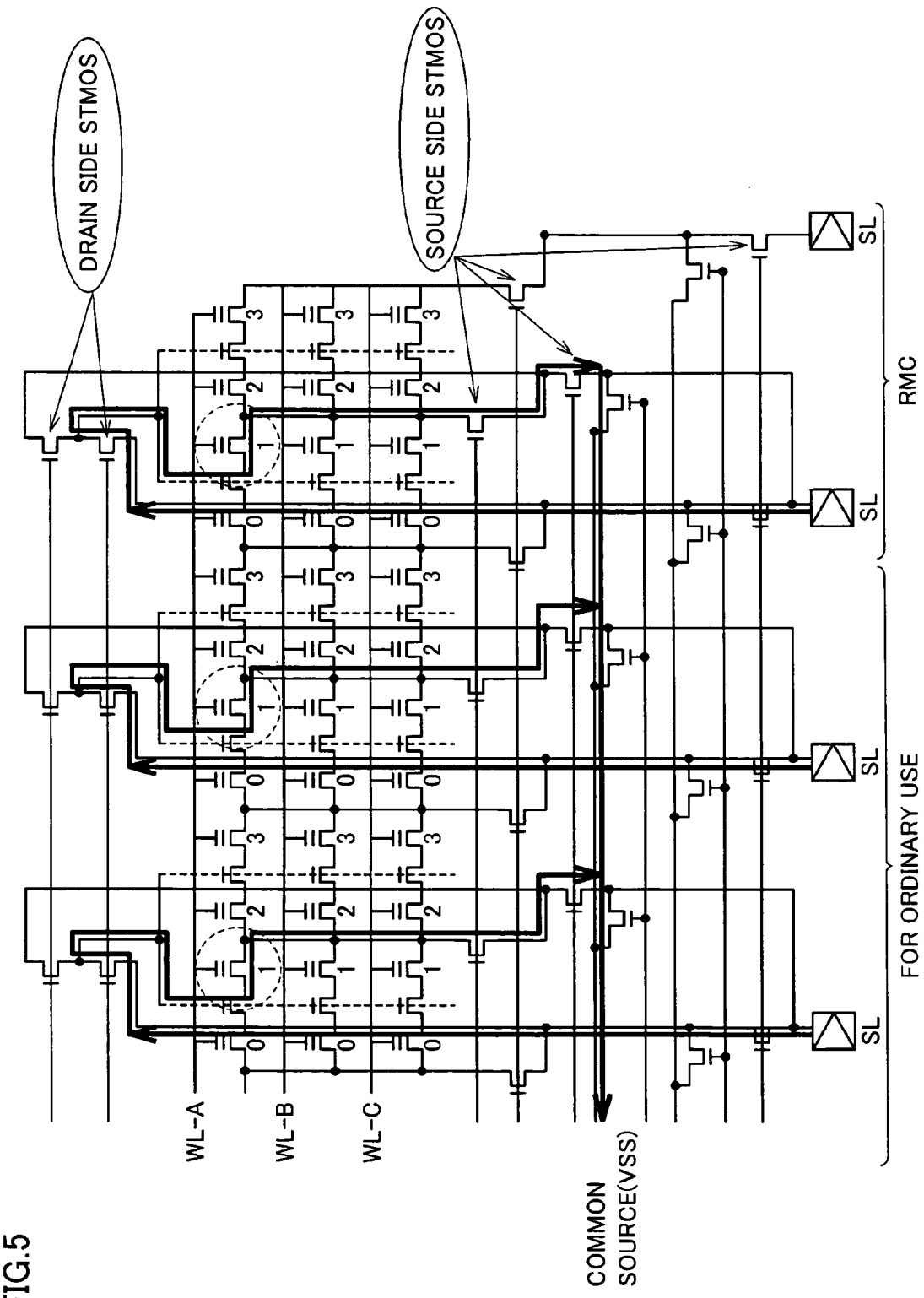
FIG. 5 is a diagram showing a further example of a structure of memory array 1 in the semiconductor storage device according to the present embodiment.
Figure 6:
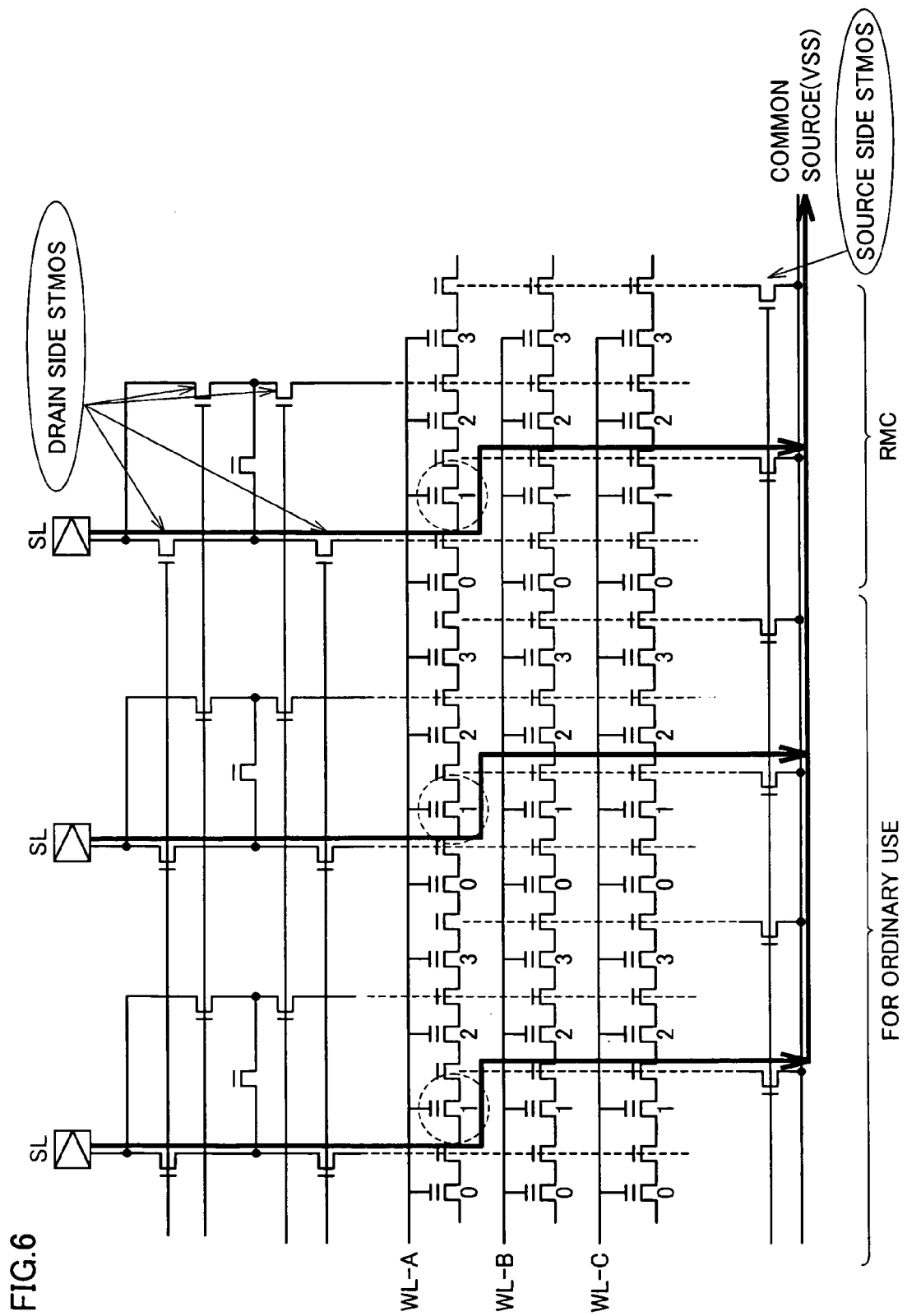
FIG. 6 is a diagram showing a still further example of a structure of memory array 1 in the semiconductor storage device according to the present embodiment.
Figure 7:
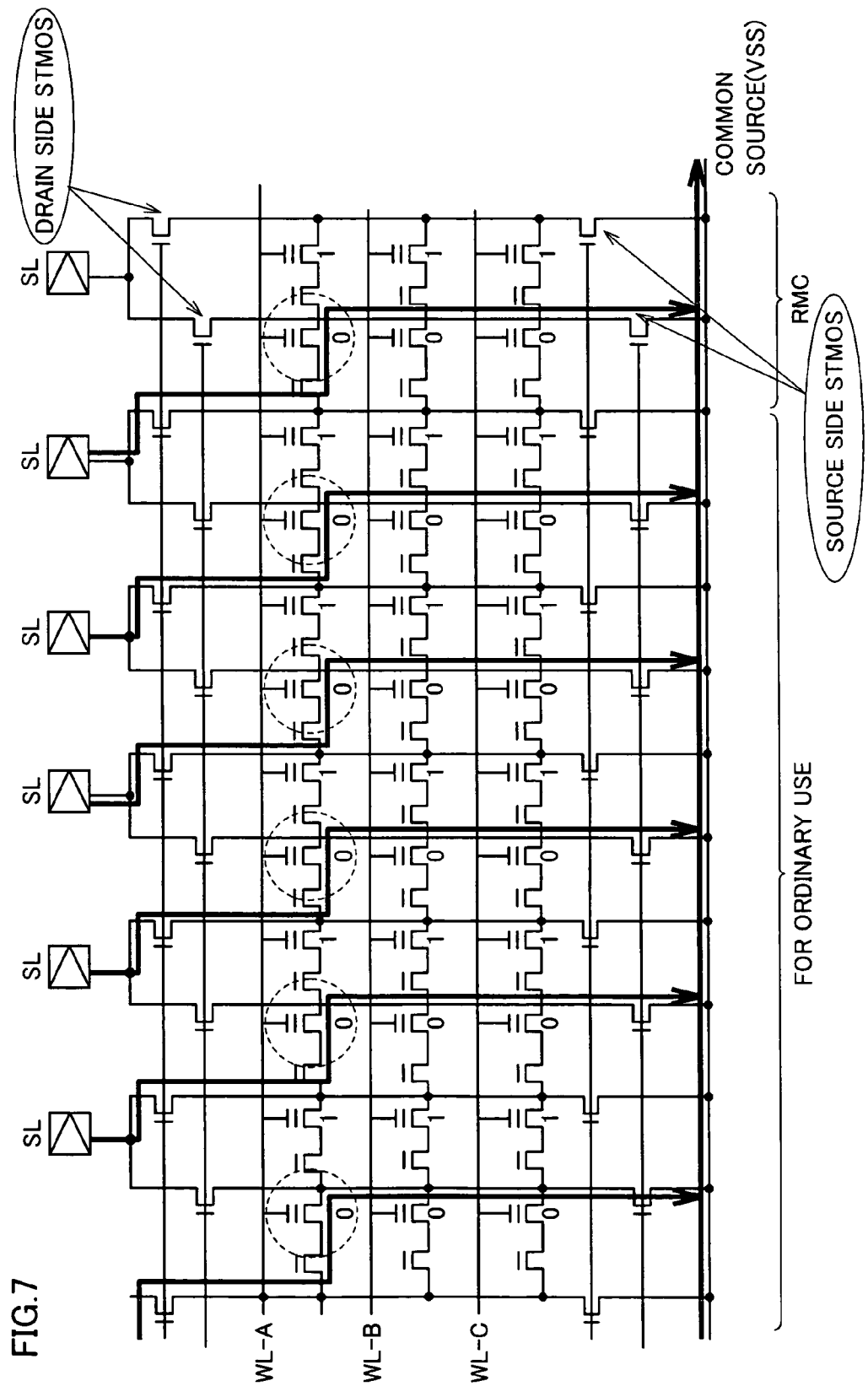
FIG. 7 is a diagram showing a still further example of a structure of memory array 1 in the semiconductor storage device according to the present embodiment.

FIG. 5 to FIG. 7 are diagrams showing further examples of a structure of memory array 1 in the semiconductor storage device according to the present embodiment, respectively. Interconnection indicated by a solid line represents a diffusion layer interconnection or a metal interconnection, an interconnection indicated by a dotted line represents an inversion layer interconnection, a memory cell surrounded by a dotted circle represents a memory cell to be read, an arrow represents a current path at the time of reading, and a numeral of the memory cell represents a page number.

With reference to FIG. 5 to FIG. 7, memory array 1 is a memory array of an AG-AND flash memory. In the AG-AND flash memory, a bit line of a memory cell transistor is formed not of a diffusion layer but of an inversion layer which is formed on a main surface of a semiconductor substrate when a voltage is applied to an assist gate (AG). This eliminates the need of forming an impurity region for forming a bit line in a memory cell region to enable scale-down of a nonvolatile semiconductor storage device. Such a technique is recited, for example, in the known literature (Y. Sasago, et. al., "90-nm-node multi-level AG-AND type flash memory with cell size of true 2 $F^2$/bit and programming throughput of 10 MB/s", IEDM Tech. Dig., (2003) p. 823).

In FIG. 5 to FIG. 7, memory array 1 includes a memory cell for ordinary use, an RMC and a selection gate (STMOS). RMC is disposed four corresponding to page 0 to page 3 in each word line.

Although arrangement of RMC is not limited to those shown in FIG. 3 to FIG. 7, such structures as shown in FIG. 3 to FIG. 7 in which RMC in each word line is disposed corresponding to a common selection gate is preferable because control of reading and writing from/to RMC can be simplified. In addition, the structure is not limited to a structure in which RMC is disposed in every word line but may be a structure in which only a necessary RMC is disposed for preventing a reading error due to Vth fluctuation of a specific memory cell.

Figure 8:
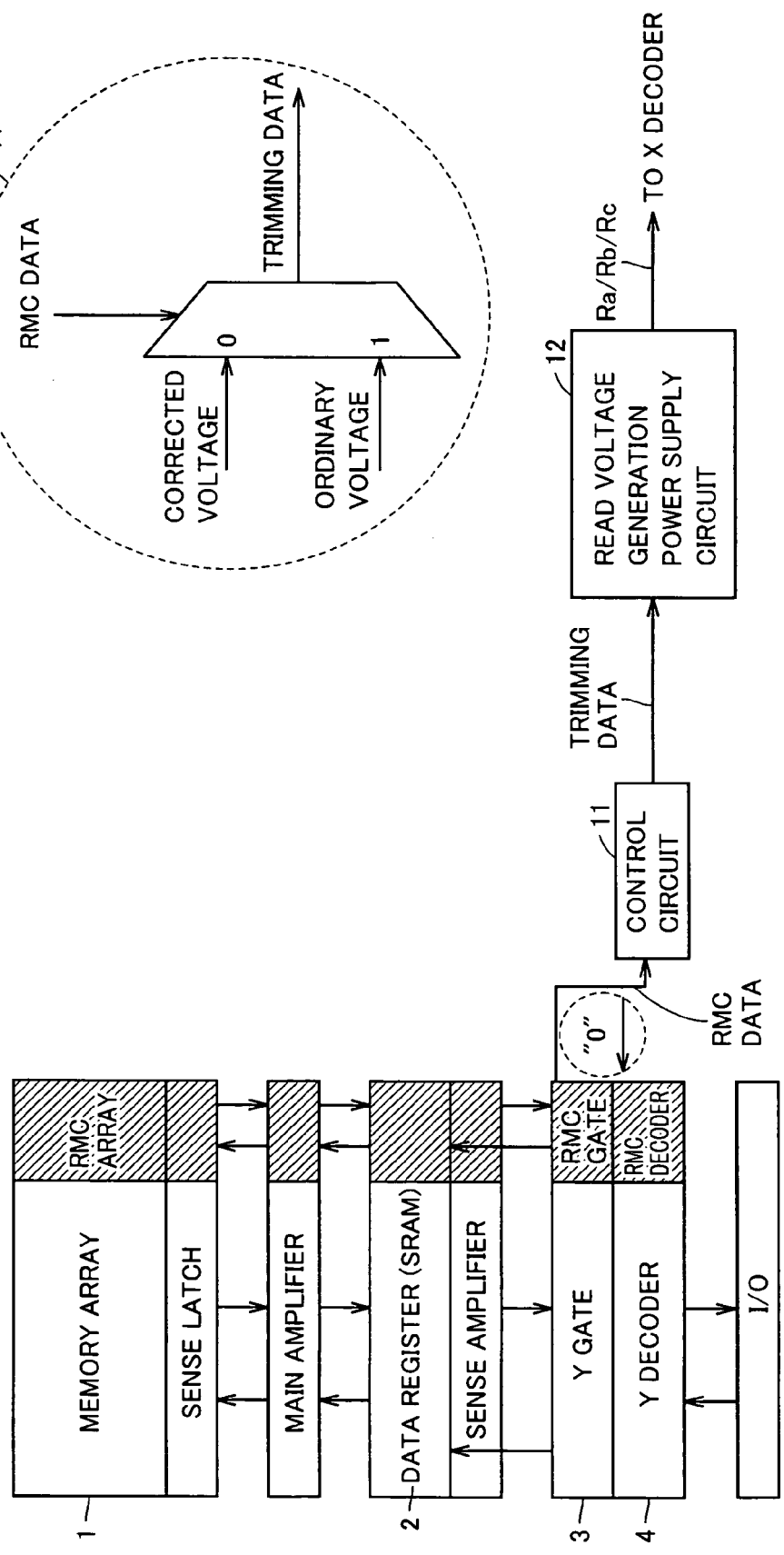
FIG. 8A is a diagram showing a flow of data at the time of writing and reading and operation of generating a read voltage in the semiconductor storage device according to the present embodiment and FIG. 8B is a diagram showing the details of a control circuit 11.

FIG. 8A is a diagram showing a flow of data at the time of writing and reading and operation of generating a read voltage in the semiconductor storage device according to the present embodiment. Part with slanting lines represents a part corresponding to RMC. FIG. 8B is a diagram showing the details of control circuit 11.

With reference to FIG. 8A, externally input data is written to memory array 1 through Y gate 3, data register 2, a main amplifier and a sense latch circuit.

Data read from memory array 1 is externally output through the sense latch circuit, the main amplifier, data register 2 and Y gate 3.

Although not shown in FIG. 1, the main amplifier is disposed between memory array 1 and data register 2 to amplify data to be written to memory array 1 and data read from memory array 1. Although not shown in FIG. 1, the sense amplifier is included in data register 2 to amplify data which is read from memory array 1 and to be output from register 2 to Y gate 3.

Here, in parts of Y gate 3 and Y decoder 4 corresponding to RMC (RMC gate and RMC decoder), no data path for the outside exists. In other words, whatever signal is input as an external signal, neither reading nor writing from/to RMC is possible. Such structure prevents external operation from causing erroneous operation of the semiconductor storage device. In addition, a reading error due to Vth fluctuation can be prevented without user's execution of special operation with respect to the semiconductor storage device.

For executing writing to a memory cell to bring the memory cell to a written state, writing to RMC corresponding to the memory cell to be written is also executed by data register 2, Y gate 3, Y decoder 4 and X decoder 5 to bring the RMC to the written state. In the NAND memory array shown in FIG. 3, for example, for executing writing to a memory cell in a word line WL-A to bring the memory cell to the written state, writing to RMC in word line WL-A is executed as well to bring the RMC to the written state.

While a logical level of data to be written to RMC here should be other than a logical level indicative of the erased state of RMC and is not specifically limited, when the semiconductor storage device stores 1-bit data, data whose logical level is "0" indicative of the written state is written to RMC. At the time of starting the semiconductor storage device, Y gate 3 and Y decoder 4, for example, preserve the data of the logical level "0" in an address corresponding to RMC of data register 2. With such structure, data of the logical level "0" is all the time written when writing to RMC is executed.

Prior to reading from a memory cell, control circuit 11 executes control to make data register 2, Y gate 3, Y decoder 4 and X decoder 5 execute reading from RMC corresponding to the adjacent memory cell. Then, when receiving the read data from Y gate 3 to find that RMC corresponding to the adjacent memory cell is in the written state, control circuit 11 corrects an ordinary read voltage to output trimming data indicative of a corrected voltage value to read voltage generation power supply circuit 12 (FIG. 8B).

Then, read voltage generation power supply circuit 12 supplies the corrected read voltage to X decoder 5.

[Operation]

Figure 9:
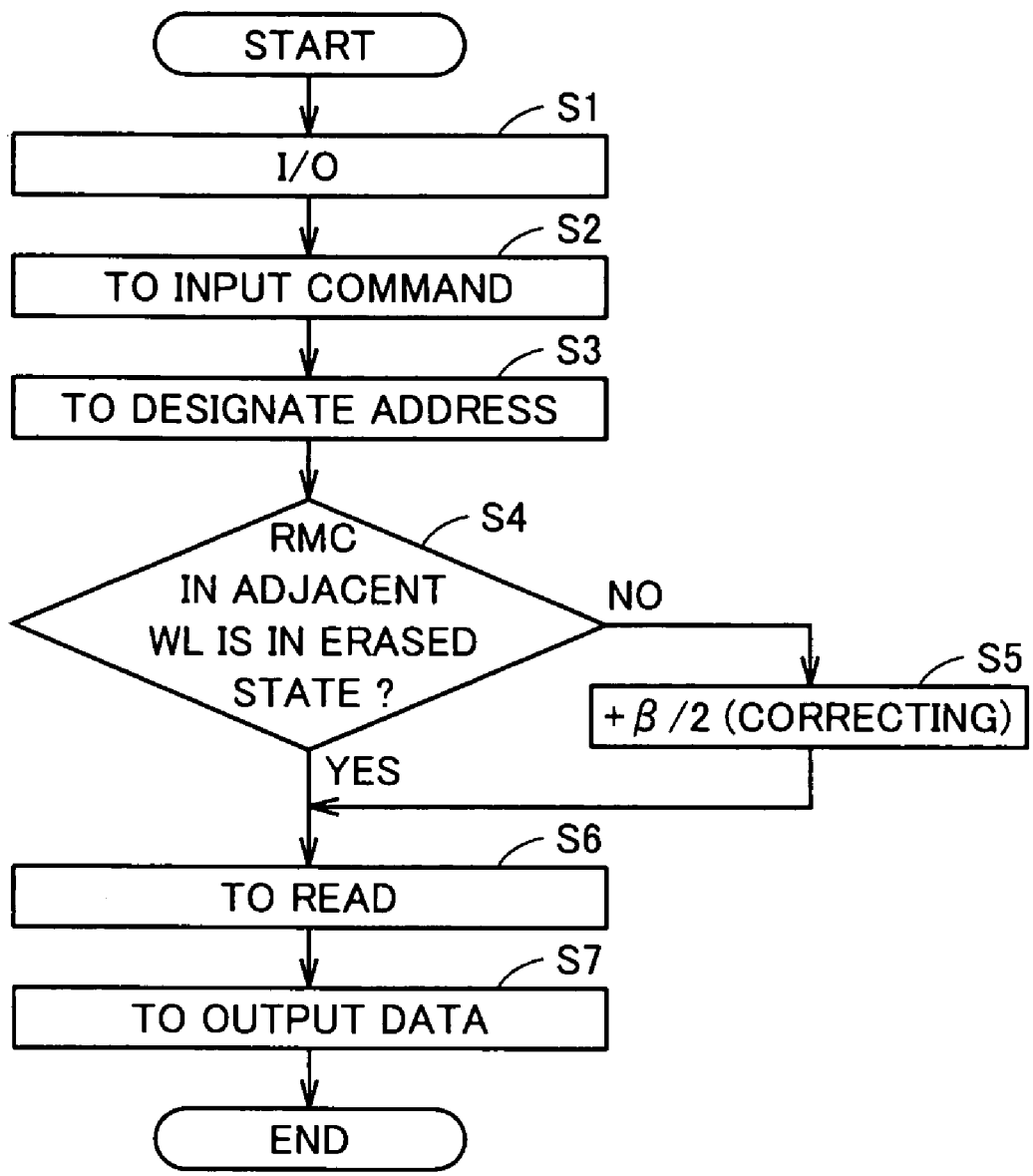
FIG. 9 is a flow chart which defines a procedure of operation executed when the semiconductor storage device according to the present embodiment reads data.

FIG. 9 is a flow chart which defines a procedure of operation executed when the semiconductor storage device according to the present embodiment reads data. In the following, description will be made assuming that word line WL-A and a word line WL-B are adjacent to each other and a memory cell to be read is connected to word line WL-B.

First, the semiconductor storage device externally receives input of an address signal and a command signal indicative of data reading (Steps S1 to S3).

Next, prior to data reading from a memory cell to be read, data register 2, Y gate 3, Y decoder 4 and X decoder 5 read data from RMC in word line WL-A adjacent to word line WL-B (Step S4).

In more details, prior to decoding an address signal received from page address buffer 10 to select word line WL-B corresponding to the memory cell to be read, X decoder selects word line WL-A adjacent to word line WL-B. Y decoder 4, prior to outputting a selection signal corresponding to the memory cell to be read to Y gate 3, outputs a selection signal corresponding to RMC in word line WL-A adjacent to word line WL-B to Y gate 3. Thus, such data reading as described above is made from RMC.

When RMC is in the written state (NO in S4), control circuit 11 outputs trimming data indicative of a voltage obtained by adding β/2 to an ordinary read voltage to read voltage generation power supply circuit 12 (S5).

On the other hand, when RMC is in the erased state (YES in S4), control circuit 11 outputs trimming data indicative of an ordinary read voltage to read voltage generation power supply circuit 12 (S5).

Then, data register 2, Y gate 3, Y decoder 4 and X decoder 5 read data from the memory cell to be read by using the read voltage supplied by read voltage generation power supply circuit 12 to externally output the data (S6 and S7).

It can be alternatively said that control circuit 11 is structured and operates in a manner as described in the following. Control circuit 11 stores a plurality of read voltages (an ordinary read voltage and a read voltage obtained by adding β/2 to the ordinary voltage) for a determination position of a logical level of data, that is, each boundary of a threshold voltage distribution corresponding to each logical level, and selects either one of these read voltages as a read voltage for the memory cell in word line WL-B according to whether RMC in word line WL-A is in the written state or the erased state.

Figure 10:
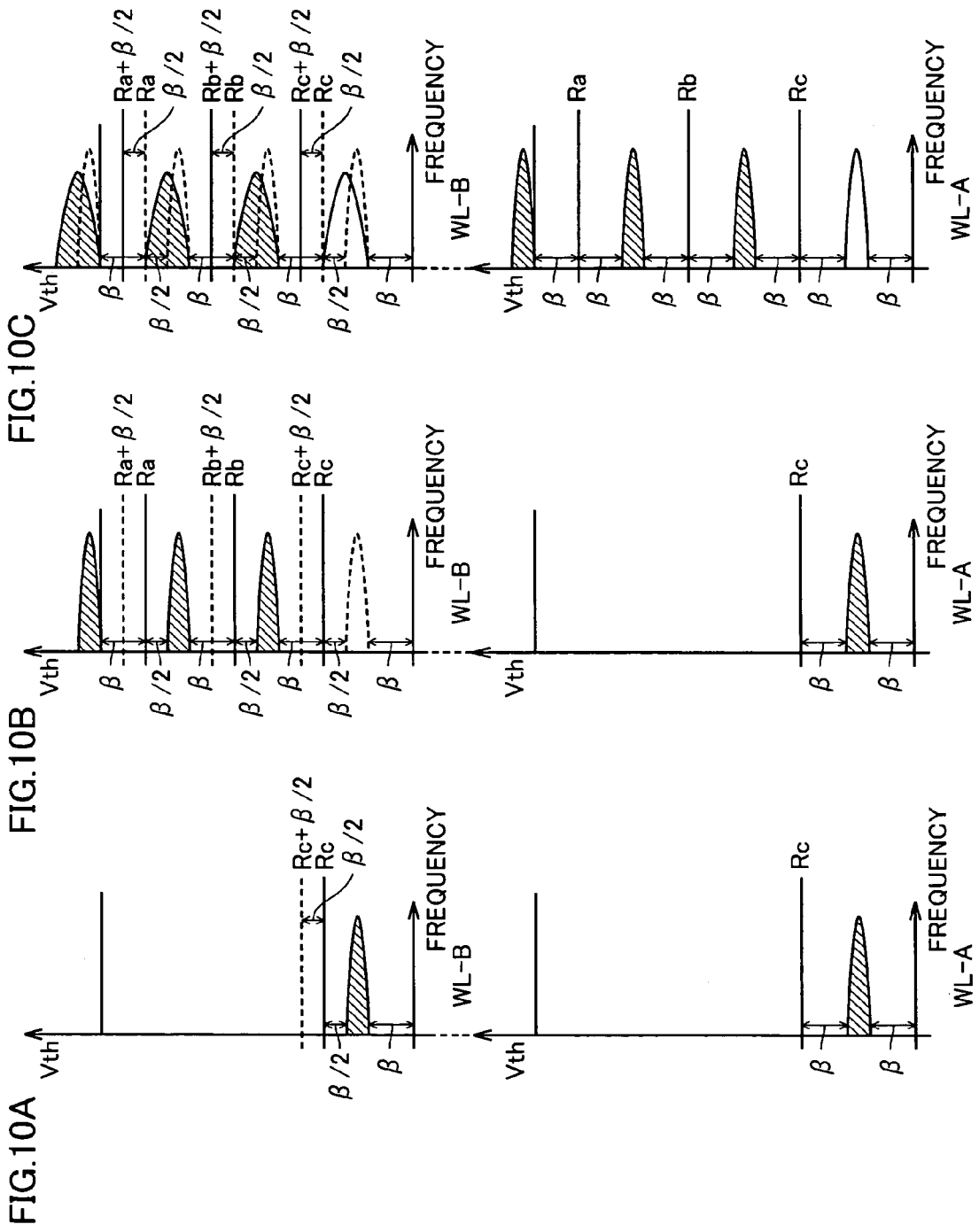
FIGS. 10A to 10C are diagrams showing Vth fluctuation due to an adjacent memory cell and correction of a read voltage executed by the semiconductor storage device according to the present embodiment.

FIGS. 10A to 10C are diagrams showing Vth fluctuation caused by an adjacent memory cell and correction of a read voltage made by the semiconductor storage device according to the present embodiment. Description will be here made of Vth fluctuation occurring in a memory cell in word line WL-B due to the effect of an adjacent memory cell in word line WL-A. For simplification, description will be made assuming that a margin of a read voltage for a threshold voltage distribution is fixed to β in word line WL-A. In addition, Ra, Rb and Rc are ordinary read voltages, that is, read voltages in the initial state. The read voltage indicated by a solid line is a read voltage currently used and the read voltage indicated by a broken line is a read voltage not currently used. A threshold voltage indicated by slanting lines is a current threshold voltage distribution of a memory cell in each state.

First, when a memory cell in word line WL-A and a memory cell in word line WL-B are in the initial state, that is, in the erased state, because no Vth fluctuation occurs, data can be read from the memory cell in word line WL-B by using an ordinary read voltage without correcting a read voltage (FIG. 10A).

Next, writing to the memory cell in word line WL-B is executed to bring the memory cell into the written state. Since word line WL-A is continuously in the erased state, no Vth fluctuation occurs in the memory cell in word line WL-B. Accordingly, data can be read from the memory cell in word line WL-B without correcting the read voltage (FIG. 10B).

Next, writing to the memory cell in word line WL-A is executed to bring the memory cell into the written state. At this time, writing to RMC in word line WL-A is executed as well to bring the RMC into the written state. Because the memory cell in word line WL-A enters the written state, Vth fluctuation due to FG-FG coupling occurs in the memory cell in word line WL-B (FIG. 10C).

This is because when writing to the memory cell in word line WL-A is executed, that is, when electrons are injected into FG of the memory cell in word line WL-A, a potential of the memory cell in word line WL-B is increased to expand the threshold voltage distribution of the memory cell in the word line WL-B toward the plus direction.

In the semiconductor storage device according to the present embodiment, however, reading of RMC in word line WL-A is executed prior to reading of the memory cell in word line WL-B. Then, when RMC in word line WL-A is in the written state, determination is made that Vth fluctuation occurs in the memory cell in word line WL-B to correct ordinary read voltages Ra, Rb and Rc, that is, to execute reading from the memory cell in word line WL-B by using a read voltage obtained by adding β/2 to ordinary read voltages Ra, Rb and Rc. Accordingly, even when Vth fluctuation occurs in the memory cell in word line WL-B, reading from the memory cell in word line WL-B can be normally executed.

Therefore, because execution of reading from the RMC in word line WL-A enables determination whether Vth fluctuation occurs in the memory cell in word line WL-B or not, a read voltage in the initial state of the memory cell in word line WL-B can be made smaller by /2 than the read voltage of the conventional semiconductor storage device shown in FIG. 2 (FIG. 10A).

Figure 11:
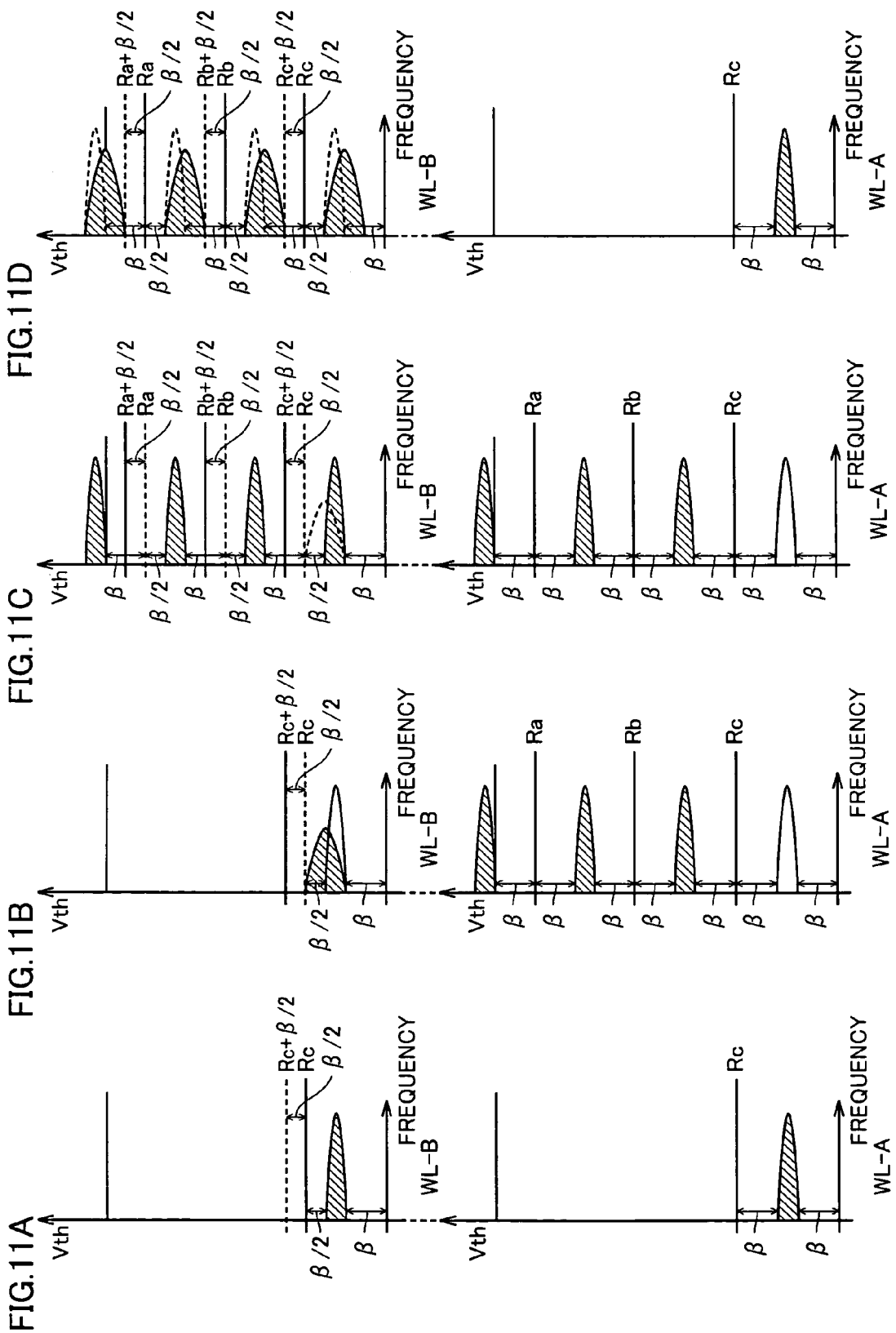
FIGS. 11A to 11D are diagrams showing Vth fluctuation due to an adjacent memory cell and correction of a read voltage executed by the semiconductor storage device according to the present embodiment.

FIGS. 11A to 11D are diagrams showing Vth fluctuation caused by an adjacent memory cell and correction of a read voltage executed by the semiconductor storage device according to the present embodiment. How the figures should be seen is the same as in the case of FIG. 10. Since FIG. 11A is the same as FIG. 10A, no description will be made thereof here.

Subsequent to the state shown in FIG. 11A, writing to the memory cell in word line WL-A is executed to bring the memory cell into the written state. In this case, similarly to FIG. 10C, Vth fluctuation due to FG-FG coupling occurs in the memory cell in word line WL-B (FIG. 11B).

Although a distribution of a threshold voltage of the memory cell in word line WL-B is expanded toward the plus direction, ordinary read voltages Ra, Rb and Rc are corrected determining that Vth fluctuation occurs in the memory cell in word line WL-B in the semiconductor storage device according to the present embodiment, so that reading from the memory cell in word line WL-B can be normally executed.

Next, writing to the memory cell in word line WL-B is executed to bring the memory cell into the written state. In this case, since the memory cell in word line WL-A remains in the same state before and after writing to the memory cell in word line WL-B, no Vth fluctuation occurs (FIG. 11C).

Here, while no Vth fluctuation occurs in the memory cell in word line WL-B, the read voltage for the memory cell in word line WL-B has been corrected as described with reference to FIG. 11B and the read voltage on the lower voltage side of the threshold voltage distribution is higher by $\beta/2$. In the semiconductor storage device according to the present embodiment here, as a margin of a read voltage on the lower voltage side of the threshold voltage distribution, $\beta$ is ensured in the initial state similarly to the setting of the conventional semiconductor storage device shown in FIG. 2. Accordingly, $\beta/2$ is ensured as a margin of a read voltage for the lower voltage side of the threshold voltage distribution to enable normal reading from the memory cell in word line WL-B.

Next, the memory cell in word line WL-A is brought into the erased state. At this time, RMC in word line WL-A is also brought into the erased state. Since the memory cell in word line WL-A changes from the written state to the erased state, Vth fluctuation due to FG-FG coupling occurs in the memory cell in word line WL-B (FIG. 11D).

This is because when the memory cell in word line WL-A changes from the written state to the erased state, that is, when electrons are extracted from FG of the memory cell in word line WL-A, the potential of the memory cell in word line WL-B is decreased to expand the threshold voltage distribution of the memory cell in word line WL-B toward the minus direction.

In this case, since RMC in word line WL-A is in the erased state, no correction of a read voltage for the memory cell in word line WL-B is made, so that read voltages Ra to Rc remain the same. In the semiconductor storage device according to the present embodiment here, as a margin of a read voltage on the lower voltage side of the threshold voltage distribution, $\beta$ is ensured in the initial state similarly to the setting of the conventional semiconductor storage device shown in FIG. 2. Accordingly, the margin of the read voltage for the lower voltage side of the threshold voltage distribution is ensured to enable normal reading of the memory cell in word line WL-B.

Figure 12:
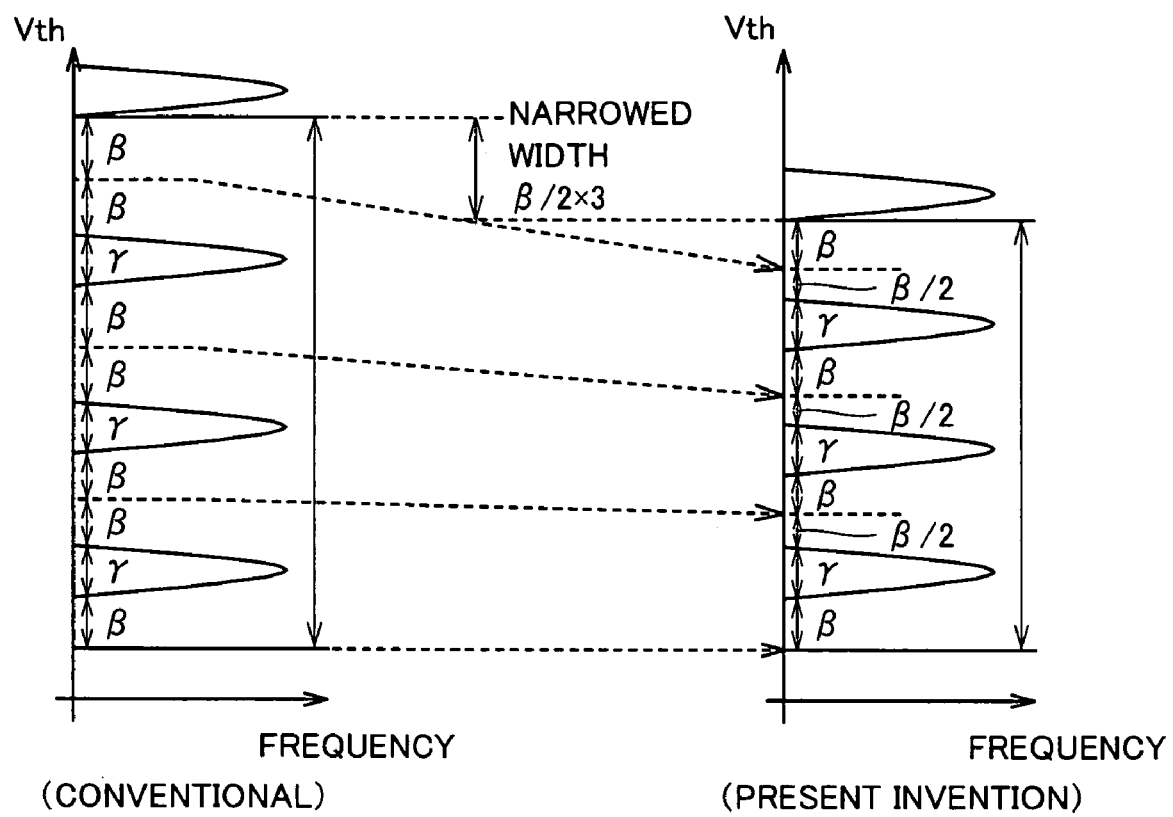
FIG. 12 is a diagram showing comparison in a Vth window width between a conventional semiconductor storage device and the semiconductor storage device according to the present embodiment.

FIG. 12 is a diagram showing comparison in a Vth window width between a conventional semiconductor storage device and the semiconductor storage device according to the present embodiment.

With reference to FIG. 12, in the conventional semiconductor storage device, a margin of a read voltage for the threshold voltage distribution is fixed and a Vth window width is $\beta \times 7 + \gamma \times 3$. On the other hand, in the semiconductor storage device according to the present embodiment, a read voltage in the initial state is set to be smaller by $\beta/2$ than the read voltage of the conventional semiconductor storage device shown in FIG. 2, that is, a read voltage margin on the higher voltage side of the threshold voltage distribution is set to be $\beta/2$. Then, only when determination is made that Vth fluctuation occurs in a memory cell, correct the read voltage to be the read voltage of the conventional semiconductor storage device shown in FIG. 2, that is, correct the read voltage margin on the higher voltage side of the threshold voltage distribution to be $\beta$. Accordingly, in the semiconductor storage device according to the present embodiment, a Vth window width will be $(\beta/2) \times 11 + \gamma \times 3$, which is a Vth window width narrower by $(\beta/2) \times 3$ than that of the conventional semiconductor storage device.

However, because the semiconductor storage device recited in Patent Literature 1 is structured to prevent a reading error due to Vth fluctuation which is caused by the effect of an adjacent memory cell in the same word line, a reading error due to Vth fluctuation which is caused by the effect of an adjacent memory cell in an adjacent word line can not be prevented. On the other hand, the semiconductor storage device according to the present embodiment executes, before executing reading from a memory cell in word line WL-B to be read, reading from RMC in an adjacent word line WL-A. Then, when RMC in word line WL-A is in the written state, it is determined that Vth fluctuation occurs in the memory cell in word line WL-B to execute reading from the memory cell in word line WL-B by using a corrected read voltage. Accordingly, it is possible to prevent a reading error due to Vth fluctuation caused by the effect of an adjacent memory cell in an adjacent word line.

Moreover, in the semiconductor storage device recited in Patent Literature 1, a reading error due to Vth fluctuation of a memory cell which stores data of not a plurality of bits but one bit can not be prevented. On the other hand, in the semiconductor storage device according to the present embodiment, when a memory cell stores 1-bit data, with a read voltage margin on the higher voltage side of a threshold voltage distribution corresponding to the logical level "0" as the written state set to be $\beta/2$, the read voltage margin on the higher voltage side in the threshold voltage distribution is corrected to P only when determination is made that Vth fluctuation occurs in the memory cell. Accordingly, the semiconductor storage device according to the present embodiment enables a reading error caused by Vth fluctuation of a memory cell storing data of not a plurality of bits but one bit to be prevented.

As can be seen from the foregoing, the semiconductor storage device according to the present embodiment enables a reading error due to Vth fluctuation to be satisfactorily prevented without expanding a Vth window.

Next, another embodiment of the present invention will be described with reference to the drawings. In the drawings, the

Second Embodiment

The present embodiment relates to a semiconductor storage device which prevents a reading error due to Vth fluctuation which is caused by the effect of memory cells in adjacent word lines on the opposite sides. Structure and basic operation of the semiconductor storage device according to the present embodiment are the same as those of the semiconductor storage device according to the first embodiment.

[Operation]

Figure 13:
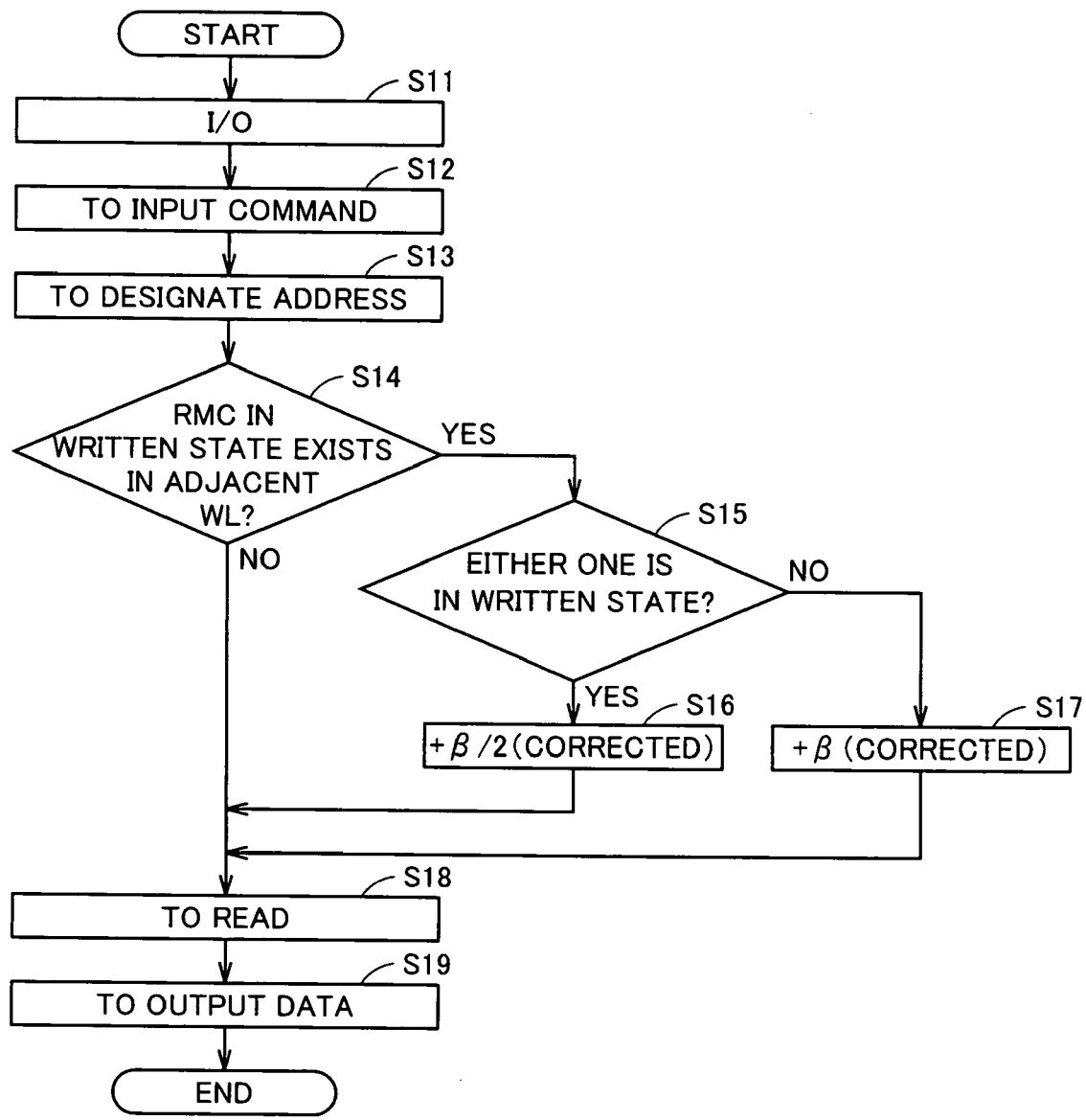
FIG. 13 is a flow chart which defines a procedure of operation executed when a semiconductor storage device according to a second embodiment of the present invention reads data.

FIG. 13 is a flow chart which defines a procedure of operation executed when the semiconductor storage device according to the second embodiment of the present invention reads data. In the following, description will be made assuming that word lines WL-A, WL-B and WL-C are adjacent and a memory cell to be read is connected to word line WL-B.

First, the semiconductor storage device externally receives input of an address signal and a command signal indicative of data reading (Steps S11 to S13).

Next, prior to data reading from a memory cell to be read, data register 2, Y gate 3, Y decoder 4 and X decoder 5 read data from RMC in word line WL-A and RMC in word line WL-C adjacent to word line WL-B (Step S14).

When either RMC in word line WL-A or RMC in word line WL-C is in the written state (YES in S14 and YES in S15), control circuit 11 outputs trimming data indicative of a voltage obtained by adding $\beta/2$ to the ordinary read voltage to read voltage generation power supply circuit 12 (S16).

In addition, when both RMC in word line WL-A and RMC in word line WL-C are in the written state (YES in S14 and NO in S15), control circuit 11 outputs trimming data indicative of a voltage obtained by adding $\beta$ to the ordinary read voltage to read voltage generation power supply circuit 12 (S17).

On the other hand, when both RMC in word line WL-A and RMC in word line WL-C are in the erased state, control circuit 11 outputs trimming data indicative of the ordinary read voltage to read voltage generation power supply circuit 12 (NO in S14).

Then, data register 2, Y gate 3, Y decoder 4 and X decoder 5 read data from the memory cell to be read by using the read voltage supplied by read voltage generation power supply circuit 12 to externally output the data (S18 and S19).

FIGS. 14A to 14C are diagrams showing fluctuation of a threshold voltage in a memory cell in word line WL-B which is caused by the effect of an adjacent memory cell and correction of a read voltage executed by the semiconductor storage device according to the present embodiment. Description will be here made of Vth fluctuation occurring in the memory cell in word line WL-B which is caused by the effects of adjacent memory cells in word line WL-A and word line WL-C. Description will be made assuming that Vth fluctuation occurring due to the effect of an adjacent memory cell in one of the adjacent word lines is $\beta/2$. How the remaining parts of the figures should be seen is the same as in the case of FIG. 10.

First, in the conventional semiconductor storage device, a read voltage margin for a threshold voltage distribution is fixed to $\beta$ (FIG. 14A). Here, FIG. 14B is an expanded diagram of a distribution of a threshold voltage corresponding to logical level "10" shown in FIG. 14A. When, for example, executing writing to the memory cell in word line WL-B in the initial state to bring the memory cell into the written state and then executing writing to either one of the memory cell in word line WL-A and the memory cell in word line WL-C to bring the memory cell into the written state, Vth fluctuation occurs by $\beta/2$ in the memory cell in word line WL-B (a threshold voltage distribution t1 in FIG. 14B). Furthermore, when executing writing to the memory cell in word line WL-A or the memory cell in word line WL-C in the erased state to bring the memory cell into the written state, Vth fluctuation occurs by P in the memory cell in word line WL-B (a threshold voltage distribution t2 in FIG. 14B). Accordingly, the conventional semiconductor storage device needs to ensure at least $\beta$ of a read voltage margin for the threshold voltage distribution all the time.

The semiconductor storage device according to the present embodiment, however, enables determination whether Vth fluctuation occurs in the memory cell in word line WL-B or not by executing reading from RMC in word line WL-A and RMC in word line WL-C, so that a read voltage in the initial state of the memory cell in word line WL-B can be made smaller by $\beta$ than the read voltage of the conventional semiconductor storage device shown in FIG. 2 (FIG. 14C).

Figure 15:
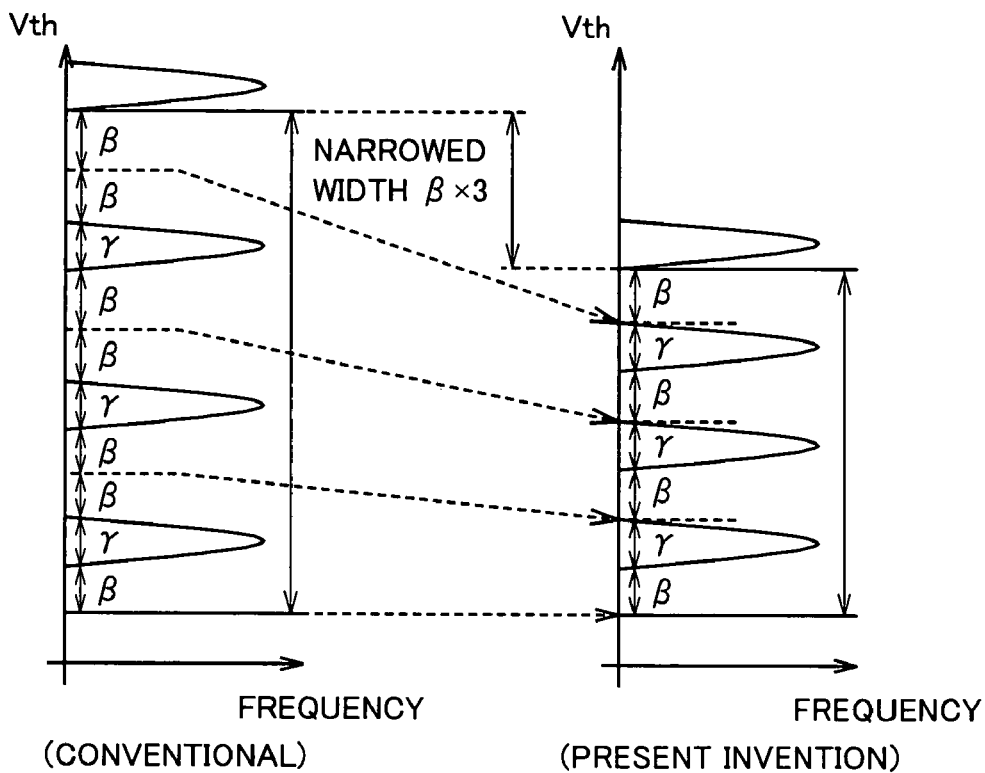
FIG. 15 is a diagram showing comparison in a Vth window width between a conventional semiconductor storage device and the semiconductor storage device according to the present embodiment.

FIG. 15 is a diagram showing comparison in a Vth window width between the conventional semiconductor storage device and the semiconductor storage device according to the present embodiment.

With reference to FIG. 15, in the conventional semiconductor storage device, a read voltage margin for the threshold voltage distribution is fixed and a Vth window width is $\beta \times 7 + \gamma \times 3$. On the other hand, in the semiconductor storage device according to the present embodiment, the read voltage in the initial state is set to be smaller by $\beta$ than the read voltage of the conventional semiconductor storage device shown in FIG. 2, that is, a margin of the read voltage on the higher voltage side of the threshold voltage distribution is set to be $\beta$. Then, only when determination is made that there occurs Vth fluctuation in a memory cell, correct the margin of the read voltage on the higher voltage side of the threshold voltage distribution to $\beta/2$ or $\beta$. Accordingly, in the semiconductor storage device according to the present embodiment, a Vth window width in the initial state will be $\beta \times 4 + \gamma \times 3$, which is narrower by $\beta \times 3$ than that of the conventional storage device, resulting in enabling a semiconductor storage device of higher quality than the semiconductor storage device according to the first embodiment to be provided.

Next, a further embodiment of the present invention will be described with reference to the drawings. The same or corresponding parts in the drawings are indicated by the same reference numerals to omit their description.

Third Embodiment

The present embodiment relates to a semiconductor storage device which prevents a reading error due to Vth fluctuation which is caused by the effect of memory cells in adjacent word lines on the opposite sides and in the same word line.

Figure 16:
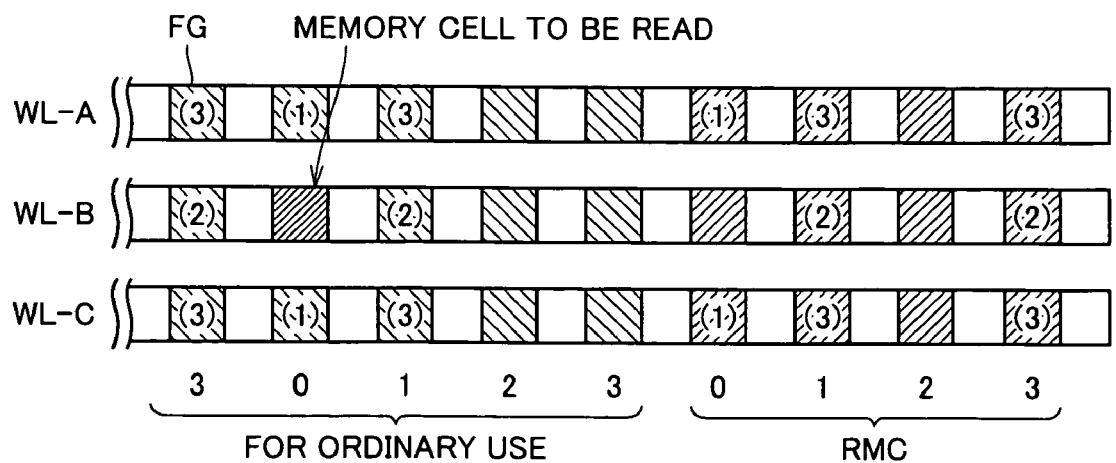
FIG. 16 is a schematic diagram showing a structure of memory array 1 in a semiconductor storage device according to a third embodiment of the present invention.

FIG. 16 is a schematic diagram showing a structure of memory array 1 in the semiconductor storage device according to the third embodiment of the present invention.

With reference to FIG. 16, memory array 1 includes word lines WL-A, WL-B and WL-C. Word lines WL-A, WL-B and WL-C are adjacent. In each word line, memory cells and RMCs corresponding to pages 0 to 3 are disposed. In the following, description will be made assuming that a memory cell to be read is a memory cell corresponding to page 0 in word line WL-B. The remaining part of the structure and basic operation are the same as those of the semiconductor storage device according to the first embodiment.

[Operation]

FIG. 17 is a flow chart which defines a procedure of operation executed when control circuit 11 in the semiconductor storage device according to the third embodiment of the present invention corrects a read voltage.

In the semiconductor storage device according to the present embodiment, similarly to the semiconductor storage devices according to the first and second embodiments, prior to data reading from a memory cell to be read, data is read from RMC corresponding to an adjacent memory cell.

First, data is read from RMCs (RMCs indicated by (1) in FIG. 16) corresponding to page 0 on word line WL-A and word line WL-C (Steps S21 and S23). When either one of these RMCs is in the written state, control circuit 11 adds an offset of +x to an ordinary read voltage. When both RMCs are in the written state, control circuit 11 adds an offset of +x×2 to the ordinary read voltage (Steps S21 to S24).

Next, data is read from RMCs (RMCs indicated by (2) in FIG. 16) corresponding to page 1 and page 3 on word line WL-B (Steps S25 and S27). When either one of these RMCs is in the written state, control circuit 11 further adds an offset of +y to the ordinary read voltage. When both RMCs are in the written state, control circuit 11 further adds an offset of +y×2 to the ordinary read voltage (Steps S25 to S28).

Next, data is read from RMCs (RMCs indicated by (3) in FIG. 16) corresponding to page 1 and page 3 on word line WL-A and word line WL-C (Steps S29, S31, S33 and S35). When one, two, three or all four of these RMCs are in the written state, control circuit 11 further adds an offset of +z, +z×2, +z×3 or +z×4 to the ordinary read voltage, respectively (Steps S29 to S36).

Then, control circuit 11 outputs trimming data indicative of a voltage obtained by adding these offsets to the ordinary read voltage to read voltage generation power supply circuit 12 (S37). Here, when all the RMCs (RMCs indicated by (1) to (3) in FIG. 16) corresponding to the adjacent memory cells are in the erased state, the offset is 0.

Accordingly, when determination is made that Vth fluctuation is the largest, an offset of x×2+y×2+z×4 will be added to the ordinary read voltage.

The offsets x, y and z to be added to the ordinary read voltage are values obtained by experiment or the like, for which values enabling a reading error caused by Vth fluctuation to be prevented are set.

Thus, the semiconductor storage device according to the present embodiment further enables the semiconductor storage devices according to the first and second embodiments to prevent a reading error due to Vth fluctuation which is caused by the effects of memory cells adjacent to a memory cell to be read in the same word line (the memory cells indicated by (2) in FIG. 16) and the effects of memory cells in adjacent word lines (memory cells indicated by (3) in FIG. 16) which are adjacent to the memory cell to be read in a slanting direction (diagonal line) in FIG. 16.

Modification Example

The present invention is not limited to the above-described embodiments but includes, for example, the following modifications.

(1) The Number of Bits of Data Which RMC Stores

Although the semiconductor storage devices according to the embodiments have the number of bits stored by RMC not specifically limited, they can be structured to have the number of bits stored by RMC smaller than the number of bits of data stored by a memory cell. Such structure enables speed-up of operation of executing reading from RMC. In addition, because there occurs Vth fluctuation also in RMC due to the effects of an adjacent RMC and an adjacent memory cell in some cases, reducing the number of bits of data stored by RMC enables a margin of a read voltage for a threshold voltage distribution to be set to be large, thereby improving reliability of an RMC reading result.

Furthermore, since for determining whether Vth fluctuation occurs or not due to the effect of an adjacent memory, it is only necessary to find whether RMC is in the written state or the erased state, RMC can be structured to make determination by a binary value, that is, structured to store one-bit data. Such structure further speeds up operation of executing reading from RMC and further improves reliability of an RMC reading result.

(2) The Number of RMCs

In the present invention, the number of RMCs to be referred to for determining whether a certain memory cell causes an adjacent memory cell to have Vth fluctuation is not limited to one and may be plural. In such a case, control circuit 11 determines whether Vth fluctuation occurs in a memory cell to be read by taking majority decision of reading results of the respective RMCs. Such arrangement enables reliability of an RMC reading result to be improved.

(3) Kind of Memory

While the structures of memory array 1 of the semiconductor storage devices according to the embodiments of the present invention have been described with respect to a memory array of a flash memory as an example, the present invention is not limited to thereto and is applicable to any nonvolatile memory that stores data by using a difference in a threshold voltage. It is applicable, for example, to an NROM (Nitride Read Only Memory), other EEPROM (Electrically Erasable Programmable Read-only Memory) than a flash memory, and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor storage device, comprising:
    a plurality of memory cells for storing data by using a difference in a threshold voltage,
    at least one reference cell for storing data indicative of a state of corresponding said memory cell by using a difference in a threshold voltage,
    a control circuit for determining a read voltage based on data stored by said reference cell corresponding to said memory cell adjacent to said memory cell to be read,
    a read unit for executing reading from said memory cell to be read by using said determined read voltage, and
    a write unit for executing writing, when executing writing to said memory cell to be written to bring the memory cell into a written state, data indicating that said memory cell to be written is in the written state to said reference cell corresponding to said memory cell to be written.

2. The semiconductor storage device according to claim 1, wherein
    said write unit, when executing writing to said memory cell to be written to bring the memory cell into the written state, sets data stored by said reference cell corresponding to said memory cell to be written to be a first logical value and when bringing said memory cell to be written into an erased state, sets data stored by said reference cell corresponding to said memory cell to be written to be a second logical value, and said control circuit determines said read voltage to be a first voltage when data stored by said reference cell corresponding to said memory cell adjacent to said memory cell to be read is said second logical value and determines said read voltage to be a second voltage higher than said first voltage when the data stored by said reference cell is said first logical value.

3. The semiconductor storage device according to claim 1, wherein said reference cell allows neither external reading nor external writing.

4. The semiconductor storage device according to claim 1, wherein said memory cell stores data of a plurality of bits by using a difference in a threshold voltage, and said reference cell stores data of the number of bits less than the number of bits of the data stored by said memory cell by using a difference in a threshold voltage.

5. The semiconductor storage device according to claim 1, wherein said control circuit determines the read voltage based on data stored by said reference cell corresponding to a memory cell adjacent to said memory cell to be read and arranged on a word line different from a word line of said memory cell to be read.

6. The semiconductor storage device according to claim 1, wherein said control circuit determines the read voltage based on data stored by said reference cell corresponding to a memory cell adjacent to said memory cell to be read and arranged on the same word line as a word line of said memory cell to be read.

7. A semiconductor storage device, comprising:

a plurality of memory cells for storing data by using a difference in a threshold voltage, at least one reference cell for storing data indicative of a state of corresponding said memory cell by using a difference in a threshold voltage, a control circuit for storing a plurality of read voltages for each determination position of a logical level of data and selecting any one of said plurality of read voltages according to data stored by said reference cell corresponding to said memory cell adjacent to said memory cell to be read, and a read unit for executing reading from said memory cell to be read by using said selected read voltage, wherein said reference cell allows neither external reading nor external writing.

\* \* \* \* \*